(12) United States Patent  
Matsudai et al.

(10) Patent No.: US 7,589,389 B2
(45) Date of Patent: Sep. 15, 2009

(54) SEMICONDUCTOR DEVICE AND METHOD OF MANUFACTURING THE SAME

(75) Inventors: Tomoko Matsudai, Tokyo (JP); Norio Yasuhara, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/264,580

(22) Filed: Nov. 4, 2008

(65) Prior Publication Data

US 2009/0065862 A1 Mar. 12, 2009

Related U.S. Application Data

(62) Division of application No. 11/502,387, filed on Aug. 11, 2006, now Pat. No. 7,473,978.

(30) Foreign Application Priority Data

Aug. 11, 2005 (JP) ............................. 2005-233570

(51) Int. Cl.
*H01L 23/58* (2006.01)
(52) U.S. Cl. .................. 257/492; 257/493; 257/340
(58) Field of Classification Search ......... 257/492–493, 257/409, 487, 340, E29.261, E27.063, E29.016
See application file for complete search history.

(56) References Cited

U.S. PATENT DOCUMENTS

| 5,912,490 A | 6/1999 | Hebert et al. |
| 5,932,897 A | 8/1999 | Kawaguchi et al. |
| 5,969,400 A | 10/1999 | Shinohe et al. |
| 6,215,152 B1 | 4/2001 | Hebert |
| 6,380,566 B1 | 4/2002 | Matsudai et al. |
| 6,552,389 B2 | 4/2003 | Yasuhara et al. |
| 6,600,182 B2 | 7/2003 | Rumennik |
| 6,876,035 B2 | 4/2005 | Abadeer et al. |
| 7,173,308 B2 | 2/2007 | Kitaguchi |
| 2004/0238913 A1* | 12/2004 | Kwon et al. ................ 257/492 |
| 2005/0145975 A1* | 7/2005 | Kumagai et al. ........... 257/493 |

FOREIGN PATENT DOCUMENTS

| JP | 4-87660 | 7/1992 |
| JP | 05-175493 | 7/1993 |
| JP | 11-354779 | 12/1999 |
| JP | 2001-102586 | 4/2001 |

* cited by examiner

*Primary Examiner*—Theresa T Doan
(74) *Attorney, Agent, or Firm*—Oblon, Spivak, McClelland, Maier & Neustadt, P.C.

(57) ABSTRACT

A semiconductor device comprising: a base layer of a first conductivity type selectively formed above a semiconductor substrate; a gate electrode formed on the base layer via the insulating film; a source layer of a second conductivity type selectively formed at a surface of the base layer at one side of the gate electrode; an channel implantation layer selectively formed at the surface of the base layer so as to be adjacent to the source layer below the gate electrode, the channel implantation layer having a higher concentration than the base layer; a RESURF layer of the second conductivity type selectively formed at the surface of the base layer at the other side of the gate electrode; and a drain layer of a second conductivity type being adjacent to the RESURF layer, a portion of the drain layer overlapping the base layer, and the drain layer having a higher concentration than the RESURF layer.

4 Claims, 7 Drawing Sheets

SEMICONDUCTOR DEVICE AND METHOD OF MANUFACTURING THE SAME

CROSS-REFERENCE TO RELATED APPLICATION

This application is a divisional of U.S. patent application Ser. No. 11/502,387 filed Aug. 11, 2006, and is based upon and claims the benefit of priority from prior Japanese Patent Application No. 2005-233570, filed on Aug. 11, 2005, the entire contents of each of which are incorporated herein by reference.

BACKGROUND OF THE INVENTION

1. Field of the Invention

The present invention relates to a semiconductor device and a method of manufacturing the same. In particular, the present invention relates to a structure of a lateral MOSFET.

2. Background Art

There is a lateral MOSFET, as one of the conventional semiconductor devices, that has a middle to high breakdown voltage and operates at a high speed. An example of the structure thereof is as follows.

In a $p^-$ type semiconductor substrate, an $n^+$ type source layer and an $n^+$ type drain layer are formed with a predetermined interval. In a region between an $n^+$ type source layer and an $n^+$ type drain layer, as a gate region, a gate electrode is formed via a gate oxide layer. Furthermore, an $n^-$ type RESURF (REduced SUFace Field) layer is formed between the gate region and the $n^+$ type drain layer. A lateral MOSFET thus constituted on the purpose of achieving a high speed operation is requested to decrease the capacitance between the gate and the drain. Various kinds of structures are employed to decrease the capacitance between the gate and the drain. However, to employ the various kinds of structures result in causing some problems such as deceasing a breakdown voltage and changing a threshold value of the MOSFET due to the structure of the lateral MOSFET.

Hereinafter, the problems will be specifically described.

As described above, it is necessary to decrease the capacitance between the gate and the drain in the lateral MOSFET. In other words, it is necessary to decrease the overlapping amount or overlapping area formed by the gate region and the drain diffusion layer. In order to satisfy the above requirement, a device should be formed as follows: Under a gate electrode, forming a p type region, the conductivity type of which is opposite to that of an n type RESURF layer or an $n^+$ type drain layer. Then performing an ion implantation in a self-aligned manner using the gate electrode as a mask to form an $n^-$ type RESURF layer.

There are following three methods to form the aforementioned structure.

First, there is a method of forming a p type well (or p type base) having an appropriate concentration as a channel region on the entire surface of the device. Generally, the concentration of a $p^-$ type semiconductor substrate serving as an active region of the device is in a range of $1\times10^{15}$ to $1\times10^{16}$ cm$^{-3}$, which is rather low as a channel region. Accordingly, sometimes a p type well serving as a channel region and having an appropriate concentration is formed on the entire surface of the device by ion implantation as in the case of a CMOS. Generally, a channel region should have a concentration of from $1\times10^{17}$ to $1\times10^{18}$ cm$^{-3}$. In this structure, however, a PN junction having relatively high concentrations is formed. When a reverse bias is applied, a depletion layer extends in the PN junction portion. However, since the concentration of the p type well is as high as $1\times10^{17}$ to $1\times10^{18}$ cm$^{-3}$, a breakdown is occurred before a sufficient depletion layer is formed. As a result, a breakdown voltage of the device in a device depth direction decreases.

Second, there is a method of forming a p type well (or p type base) only in a source region, and performing p type channel implantation on part of a region under the gate electrode, besides the p type well. Since a channel implantation layer has a concentration of $1\times10^{17}$ to $1\times10^{18}$ cm$^{-3}$, a displacement of a mask for performing a channel implantation affects the threshold value of the device. In order to secure a breakdown voltage at the drain region, the substrate portion should be a $p^-$ type semiconductor substrate having a concentration of $1\times10^{15}$-$1\times10^{16}$ cm$^{-3}$ or a $p^-$ type layer having a similar concentration. Accordingly, a mask displacement of the channel implantation layer having a concentration of $1\times10^{17}$-$1\times10^{18}$ cm$^{-3}$ has much effect on the threshold value. If the gate length is relatively long, the ratio of the mask displacement portion is rather small and the effect thereof is not so great. However, as the gate length decreases, the effect thereof reaches a level that cannot be ignored.

Third, there is a method of inserting or forming a channel implantation layer into or on the entire region under a gate electrode. Generally, since a channel implantation layer is a shallow diffusion layer, no high concentration PN junction is formed in an element depth direction in a drain region portion. However, since the channel implantation layer having a concentration of $1\times10^{17}$-$1\times10^{18}$ cm$^{-3}$ overlaps the $n^-$ type RESURF layer having a concentration of $1\times10^{16}$-$1\times10^{18}$ cm$^{-3}$ at the tip portion close to the gate electrode, the concentration of the $n^-$ type RESURF layer in this portion extremely decreases. Accordingly, a high resistance component is formed at the portion where the concentration decreases, thereby the ON resistance of the device increases.

SUMMARY OF THE INVENTION

A semiconductor device according to a first embodiment of the present invention includes:

a base layer of a first conductivity type selectively formed above a semiconductor substrate;

a gate electrode formed on the base layer via the insulating film;

a source layer of a second conductivity type selectively formed at a surface of the base layer at one side of the gate electrode;

a channel implantation layer selectively formed at the surface of the base layer so as to be adjacent to the source layer below the gate electrode, the channel implantation layer having a higher concentration than the base layer;

a RESURF layer of the second conductivity type selectively formed at the surface of the base layer at the other side of the gate electrode; and a drain layer of a second conductivity type being adjacent to the RESURF layer, a portion of the drain layer overlapping the base layer, and the drain layer having a higher concentration than the RESURF layer.

A semiconductor device according to a second embodiment of the present invention includes:

a semiconductor layer of a second conductivity type formed above a semiconductor substrate;

a base layer of a first conductivity type selectively formed at a surface of the semiconductor layer;

a gate electrode formed on the base layer via the insulating film;

a source layer of a second conductivity type selectively formed at a surface of the base layer at one side of the gate electrode;

a channel implantation layer selectively formed at the surface of the base layer so as to be adjacent to the source layer below the gate electrode, the channel implantation layer having a higher concentration than the base layer;

a RESURF layer of the second conductivity type selectively formed at the surface of the base layer and the surface of the semiconductor layer at the other side of the gate electrode, so as to overlap the base layer and the semiconductor layer; and a drain layer of the second conductivity type selectively formed at the surface of the semiconductor layer so as to be adjacent to the RESURF layer, the drain layer having a higher concentration than the RESURF layer and the semiconductor layer.

A method of manufacturing a semiconductor device according to a third embodiment of the present invention includes:

selectively forming a base layer of a first conductivity type at a surface of the semiconductor layer;

selectively forming a first impurity layer at the surface of the base layer for forming an channel implantation layer, the channel implantation layer having a first conductivity type and having a high concentration than the base layer;

forming a gate electrode on both the first impurity layer and the base layer via a gate oxide film so as to bridge across the first impurity layer and the base layer;

forming a second impurity layer for forming a RESURF layer of a second conductivity type in the base layer at one side of the gate electrode using the gate electrode as a mask; and forming a drain layer of the second conductivity type in the second impurity layer at a portion distant from the gate electrode, the drain layer having a high concentration than the second impurity layer, thereby defining a gate electrode side of the second impurity layer as the RESURF layer, forming a source layer of the second conductivity type in the first impurity layer at a portion outside the gate electrode using the gate electrode, and thereby defining a portion located below the gate electrode in the first impurity layer as an channel implantation layer.

According to the embodiments of the present invention, it is possible to provide a semiconductor device operating at a high speed with a stable threshold value.

DESCRIPTION OF THE EMBODIMENTS

First Embodiment

Figure 1:
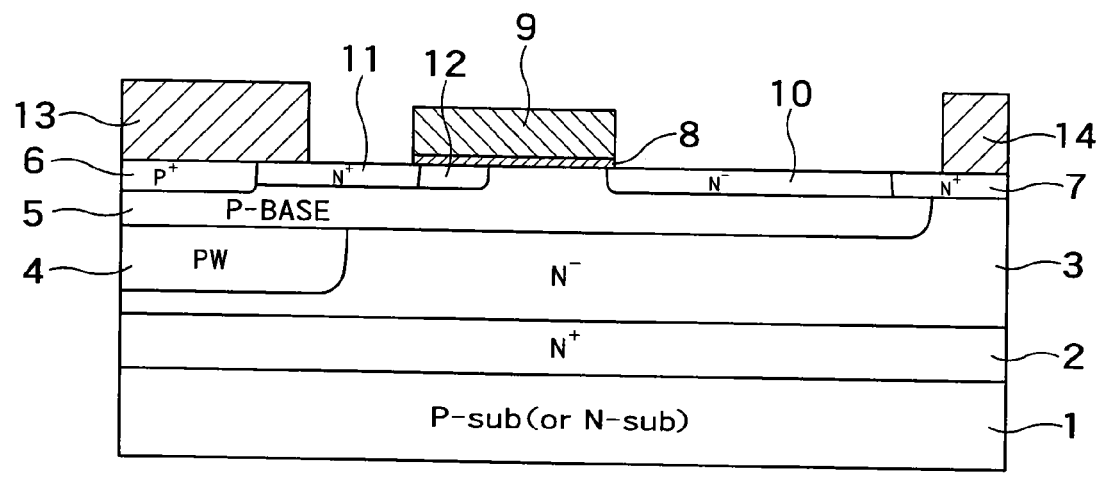
FIG. 1 is a sectional view of a semiconductor device according to a first embodiment of the present invention.

FIG. 1 is a sectional view of a semiconductor device according to a first embodiment of the present invention.

As shown in FIG. 1, a semiconductor layer of an $n^+$ type (second conductivity type) serving as a low resistance layer 2 is formed on a substrate 1 of a p type (first conductivity type). Then, a semiconductor layer of an $n^-$ type (second conductivity type) serving as a high resistance layer 3 is formed thereon.

Based on this substrate structure, a p type well 4, a p type base layer 5, an ion or impurity implanted channel region 12, an $n^-$ type RESURF layer 10, an $n^+$ type source layer 11, an $n^+$ type drain layer 7, a $p^+$ type layer 6 are selectively formed on the $n^-$ type high resistance layer 3.

The ion implanted channel region 12 of P type is selectively formed in the p type base layer 5, and a gate insulating film 8 and a gate electrode 9 are formed thereon. Next, the $n^-$ type RESURF layer 10 is formed at one side of the gate electrode using the gate electrode 9 as a mask. Subsequently, the $n^+$ type drain layer 7 is formed at the side of the $n^-$ type RESURF layer 10, and the $n^+$ type source layer 11 and the $p^+$ type layer 6 are formed at the opposite side. A source electrode 13 is formed on the $n^+$ type source layer 11 and the $p^+$ type layer 6, and a drain electrode 14 is formed on the $n^+$ type drain layer 7, respectively.

In this structure, the p type base layer 5 is formed from the source side to the drain side, and the region under the gate is of a conductivity type (in this case a p type) opposite to the conductivity type of the $n^+$ type drain layer 7 and the $n^-$ type RESURF layer 10. Since the $n^-$ type RESURF layer 10 is formed using the gate electrode 9 as a mask, it is possible to decrease the overlapping portion of the gate electrode 9 and the $n^-$ type RESURF layer 10 to a minimum level, as shown in FIG. 1. As a result, it is possible to decrease the gate-drain capacitance to a minimum level, thereby obtaining a MOSFET operating at a high speed.

As described above, since the p type base layer 5 is formed in the entire portion of the region under the gate, and the ion implanted channel region 12 is selectively formed, it is possible to curb the influence of the fluctuations in threshold value caused by mask displacement in the ion implanted channel region 12 without degrading the electrical characteristics such as ON resistance. The reason is as follows.

Because of the structure where the ion implanted channel region 12 and the p type base layer 5 overlap each other in the region under the gate, the threshold value in the region under the gate is determined not by the concentration of the ion implanted channel region 12 but the concentrations of the p type base layer 5 and the ion implanted channel region 12. Generally, a p type base layer has a concentration of $1 \times 10^{16}$-$1 \times 10^{18}$ cm$^{-3}$, and the ion implanted channel region has a concentration of $1 \times 10^{17}$-$1 \times 10^{18}$ cm$^{-3}$. If the threshold value is determined only by channel implantation, the diffusion layer having a concentration of $1 \times 10^{17}$-$1 \times 10^{18}$ cm$^{-3}$ changes in the region under the gate due to the mask displacement, resulting in the change in threshold value characteristics. In contrast with this, if a p type base layer is formed in the entire region under the gate, the ion implanted channel region can be formed considering the concentration thereof. That is to say, if a p type base layer is formed in the entire region under the gate, an ion implanted channel region with lower impurity concentration by the concentration of the p type base layer is enough comparing with the device where a threshold value thereof is determined only by an ion implanted channel region. As a result, the influence of the occurrence of mask displacement on the fluctuations in threshold value is small.

When an ion implanted channel region having a concentration of $1 \times 10^{17}$-$1 \times 10^{18}$ cm$^{-3}$ is formed in the entire region under the gate, although no mask displacement occurs, there is a fear that the concentration at the tip portion of the n$^-$ type RESURF layer 10 is extremely decreased, and with a resistance component added thereon, the ON resistance of the device is increased. In contrast with this, in this embodiment of the present invention, since only the p type base layer, which has a lower concentration than the ion implanted channel region, overlaps the n$^-$ type RESURF layer 10, the decrease in concentration at the tip portion of the n$^-$ type RESURF layer 10 is curbed, thereby preventing the degradation in ON resistance.

Furthermore, in this embodiment of the present invention, the edges of the p type base layer (diffusion layer) 5 and the n$^+$ type drain layer 7 overlap each other, i.e., the p type base layer 5 and the n$^-$ type RESURF layer 10 completely overlap each other. The concentration of the n$^-$ type RESURF layer 10 can be decided in consideration of the overlap thereof.

Since the n$^+$ type drain layer 7 and the p type base layer 5 do not completely overlap each other, the n$^+$ type drain layer 7 and the n$^-$ type (second conductivity type) semiconductor layer serving as the high resistance layer 3 partially contact each other. If they completely overlap each other, there is a fear that a high concentration PN junction is formed between the n$^+$ type drain layer 7 and the p type base layer 5 thereby decreases the breakdown voltage of the device. However, in this embodiment of the present invention, such a problem can be solved.

With the aforementioned structure, it is possible to obtain a semiconductor device having a very stable threshold value and operating at a high speed. Furthermore, it is possible to avoid a decrease in breakdown voltage and an increase in ON resistance.

Second Embodiment

Figure 2:
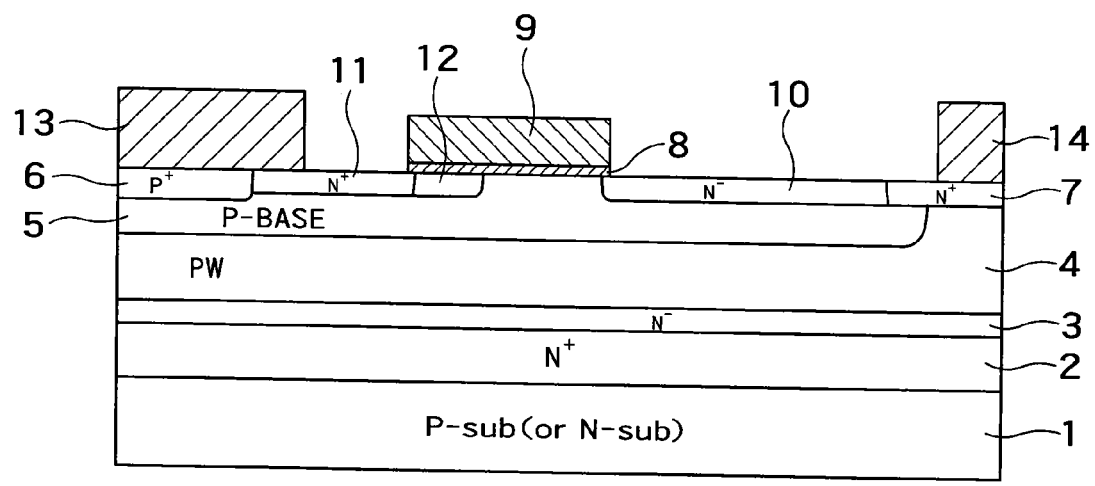
FIG. 2 is a sectional view of a semiconductor device according to a second embodiment of the present invention.

FIG. 2 is a sectional view of a semiconductor device according to a second embodiment of the present invention.

As shown in FIG. 2, the second embodiment differs from the first embodiment in that the p type well 4 extends to cover the entire portion of the device. In this case, since the p type well 4 and the source electrode 13 electrically contact each other via the p type base layer 5 and the p$^+$ type layer 6, the device has a potential difference between the source and the drain in a vertical direction at the drain side. Since the p type well layer 4, which is not formed to decide the threshold value, as in the case of this embodiment, generally has a low concentration of $1 \times 10^{15}$-$1 \times 10^{17}$ cm$^{-3}$, it is possible to prevent the decrease in breakdown voltage at the PN junction between the n$^+$ type drain layer 7 and the p type well layer 4.

Accordingly, like the first embodiment, it is possible to obtain a semiconductor device having a stable threshold value and operating at a high speed.

Third Embodiment

Figure 3:
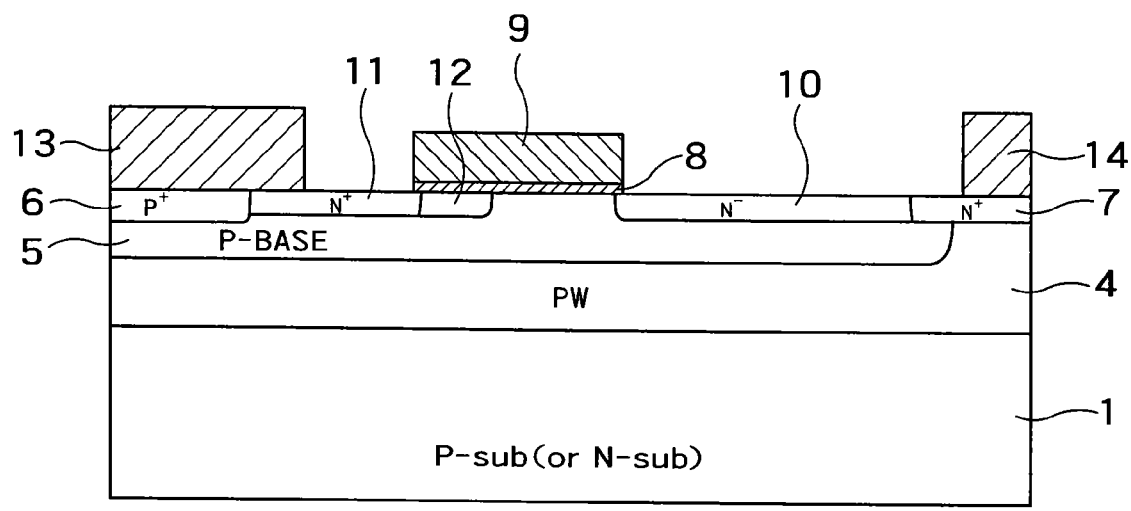
FIG. 3 is a sectional view of a semiconductor device according to a third embodiment of the present invention.

FIG. 3 is a sectional view of a semiconductor device according to a third embodiment of the present invention.

As shown in FIG. 3, the third embodiment differs from the second embodiment in that the n$^+$ type embedded layer serving as the low resistance layer 2 and the n$^-$ type layer serving as the high resistance layer 3, which are formed on the substrate 1 at the lower portion of the device in an overlapping manner as shown in FIG. 2, are removed.

As in the case of the second embodiment, the p type well layer 4 extends to cover the entire device in this embodiment. Accordingly, it is possible to decide the device condition by adjusting the potential of the p type well layer 4. Thus, if there is no embedded n$^+$ type layer serving as the low resistance layer 2 and n$^-$ type layer serving as the high resistance layer 3 as in the case of the third embodiment, it is possible to obtain the same effect as in the second embodiment.

Fourth Embodiment

Figure 4:
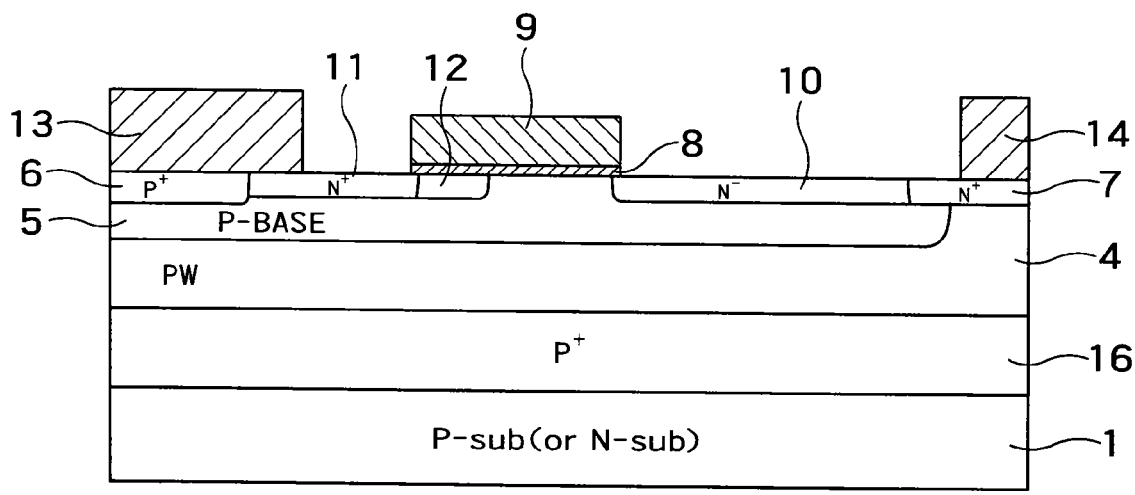
FIG. 4 is a sectional view of a semiconductor device according to a fourth embodiment of the present invention.

FIG. 4 is a sectional view of a semiconductor device according to a fourth embodiment of the present invention.

As shown in FIG. 4, the fourth embodiment differs from the second embodiment in that a p$^+$ type embedded layer serving as a p$^+$ type layer 16 is formed instead of the n$^+$ layer embedded layer serving as the low resistance layer 2 and the n$^-$ type layer serving as the high resistance layer 3.

Like the third embodiment, since the potential of the device can be decided by the p type well layer 4 and the p$^+$ type layer 16, it is possible to obtain the same effect as the second embodiment.

Fifth Embodiment

Figure 5:
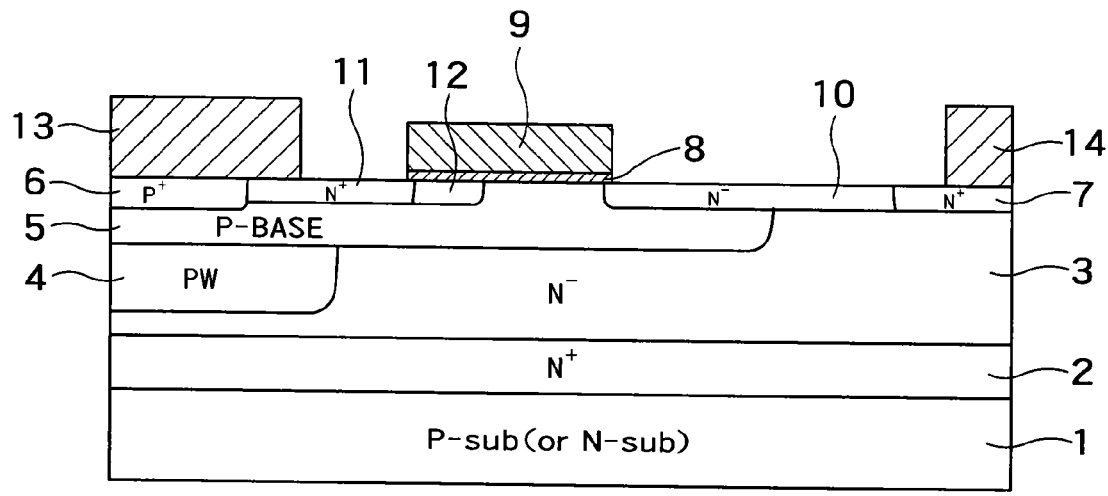
FIG. 5 is a sectional view of a semiconductor device according to a fifth embodiment of the present invention.

FIG. 5 is a sectional view of a semiconductor device according to a fifth embodiment of the present invention.

As shown in FIG. 5, the fifth embodiment differs from the first embodiment in that the tip portion of the p type base layer 5 is shifted to left in the drawing. That is to say, the p type base layer 5 overlaps only part of the n$^-$ type RESURF layer 10.

In the fifth embodiment, since the p type base layer 5 overlaps only part of the n$^-$ RESURF layer 10, the n$^-$ type RESURF layer 10 substantially has two concentrations. Specifically, the portion of the n$^-$ type RESURF layer 10 close to the gate region has a lower concentration since it overlaps the p type base layer 5. Since the n$^-$ type RESURF layer 10 has two concentrations, it not only has a stable breakdown voltage, but also has an ON breakdown voltage (a breakdown voltage in an on-state of the gate).

As a result, also in the fifth embodiment, it is possible to obtain the same effect as the first embodiment and to secure the ON breakdown voltage.

Sixth Embodiment

Figure 6:
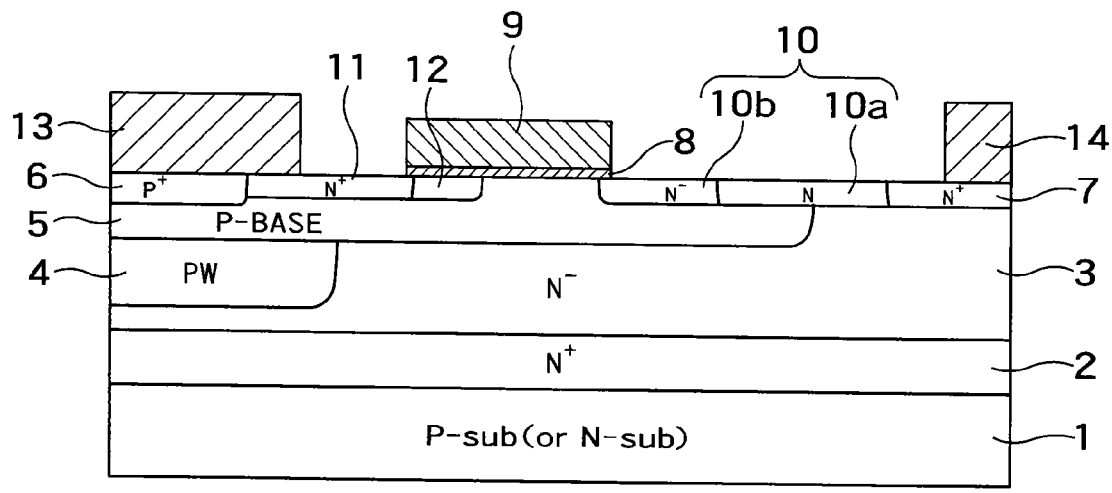
FIG. 6 is a sectional view of a semiconductor device according to a sixth embodiment of the present invention.

FIG. 6 is a sectional view of a semiconductor device according to a sixth embodiment of the present invention.

As shown in FIG. 6, the sixth embodiment differs from the fifth embodiment in that the n$^-$ type RESURF layer 10 (10a, 10b) has a two-stage structure.

That is to say, in order to secure ON breakdown voltage, the n⁻ type RESURF layer 10 (10a, 10b) has a two-stage structure and the p type base layer 5 overlaps part of the n⁻ type RESURF layer 10a.

In the sixth embodiment, since the n⁻ type RESURF layer 10 (10a, 10b) has a two-stage concentration gradient, the electric field concentration can be eased. Furthermore, in this embodiment, since the p type base layer 5 overlaps part of the n⁻ type RESURF layer 10a, it is possible to obtain substantially the same effect as the case where the n⁻ type RESURF layer 10 (10a, 10b) has a three-stage structure. That is to say, in FIG. 6, the substantial concentration of the n type RESURF layer 10 (10a, 10b) has three stages, which is a concentration obtained by the left side n type RESURF layer 10b (n⁻) and the p type base layer 5 located or formed therebelow, a concentration obtained by part of the central part of the n⁻ type RESURF layer 10a (left side) and the p type base layer 5 located therebelow, and a concentration obtained by the remaining part of the n⁻ type RESURF layer N10a (right side). Although the n⁻ type RESURF layer 10 (10a, 10b) has two stages in this embodiment, it is possible to further improve the electric field easing effect by further increasing the number of stages.

As a result, in the sixth embodiment, it is possible to obtain the same effect as the fifth embodiment.

Next, a method of manufacturing a semiconductor device shown in FIG. 1 will be described below. In the following descriptions, detailed explanations on resist film formation, exposure, development, etching, resist pattern removal, etc. will be omitted.

Figure 7:
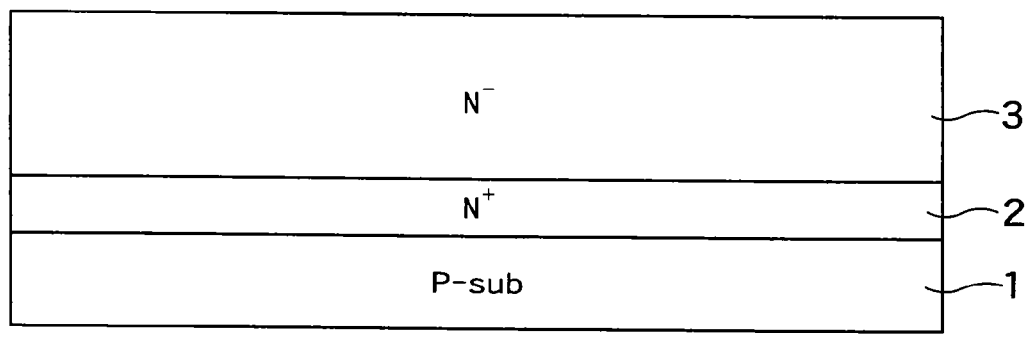
FIG. 7 is a sectional view showing a step of a process of manufacturing a semiconductor device shown in FIG. 1.

First, as can be understood from FIG. 7, an n⁺ type semiconductor layer serving as a low resistance layer (n⁺) 2 and an n⁻ type semiconductor layer serving as a high resistance layer (n⁻) 3 are formed on a p type substrate 1.

Figure 8:
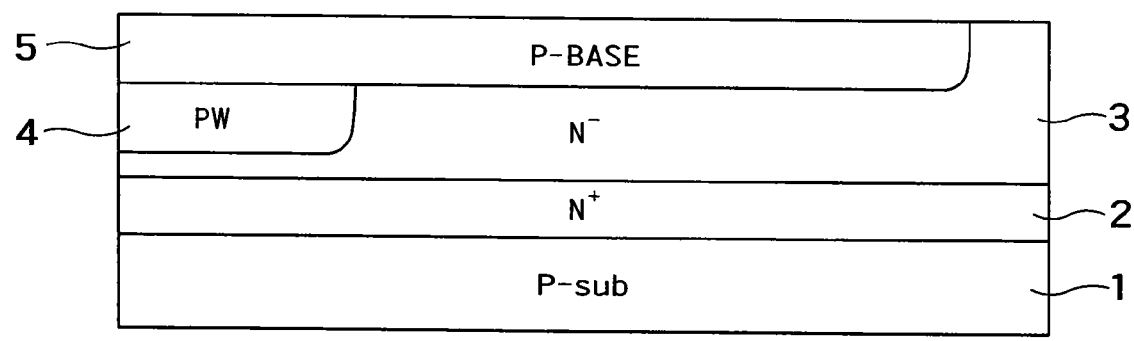
FIG. 8 is a sectional view showing a step following FIG. 7 of the process of manufacturing a semiconductor device shown in FIG. 1.

Then, as can be understood from FIG. 8, a p type well 4 and a p type base layer 5 are selectively formed in the high resistance layer (n⁻) 3 by performing the injection or diffusion of a p type impurity.

Figure 9:
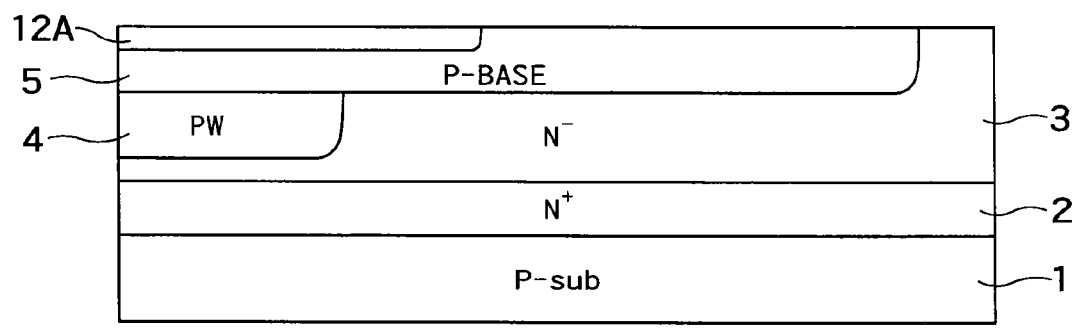
FIG. 9 is a sectional view showing a step following FIG. 8 of the process of manufacturing a semiconductor device shown in FIG. 1.

Subsequently, as can be understood from FIG. 9, a p type impurity region 12A for forming an ion implanted channel region 12 is selectively formed in the p type base layer 5 by performing the injection or diffusion of an impurity.

Figure 10:
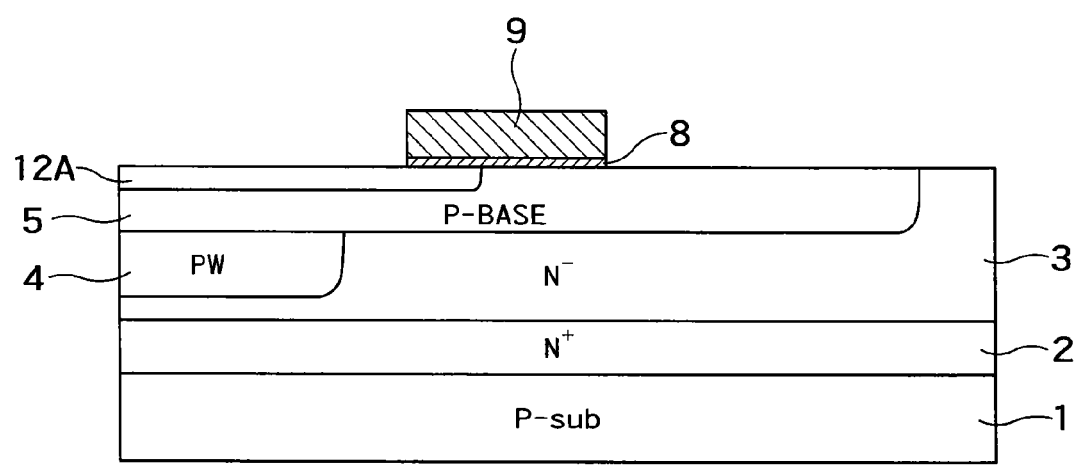
FIG. 10 is a sectional view showing a step following FIG. 9 of the process of manufacturing a semiconductor device shown in FIG. 1.

Thereafter, as shown in FIG. 10, a gate insulating film material layer of $SiO_2$ and so on is formed on the impurity region 12A, the p type base layer 5, and the high resistance layer (n⁻) 3, a gate electrode material layer of polycrystalline silicon and so on is deposited thereon, and then these layers are patterned to form the gate insulating film 8 and the gate electrode 9 shown in the drawing. The relative shift between the gate electrode 9 and the tip of the impurity region 12A is a so-called mask displacement.

Figure 11:
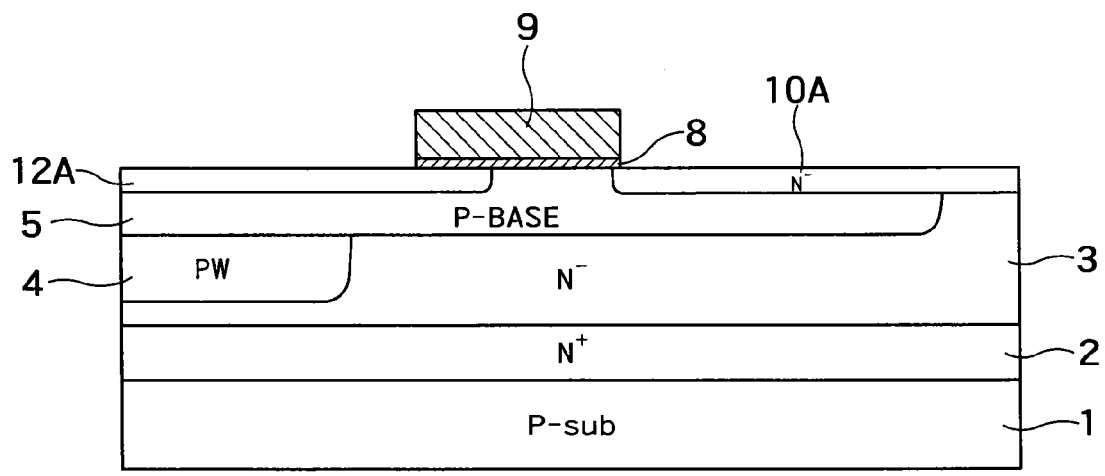
FIG. 11 is a sectional view showing a step following FIG. 10 of the process of manufacturing a semiconductor device shown in FIG. 1.

Then, as shown in FIG. 11, an impurity layer (n⁻) 10A is formed by the injecting or diffusing of an n type impurity, using the gate electrode 9 as a mask.

Figure 12:
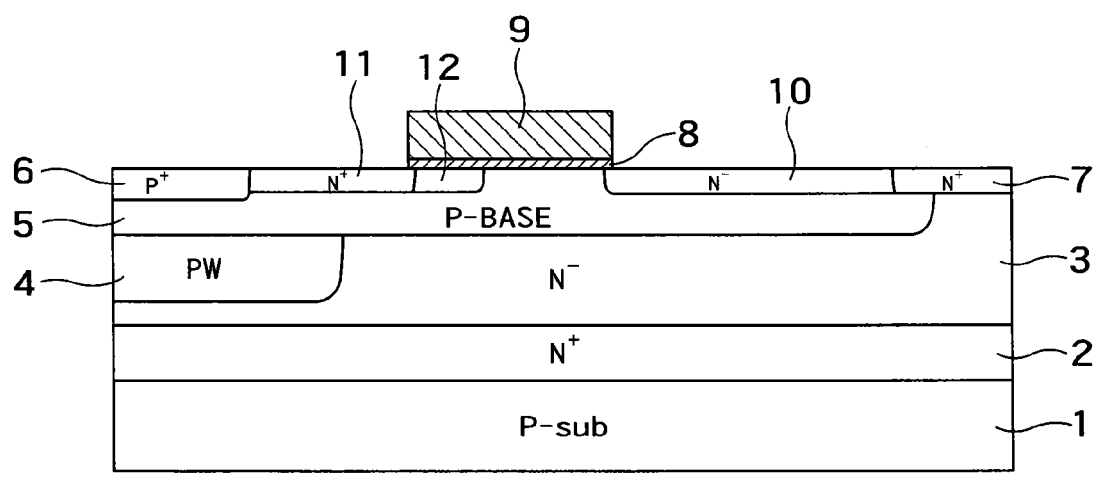
FIG. 12 is a sectional view showing a step following FIG. 11 of the process of manufacturing a semiconductor device shown in FIG. 1.
Figure 13:
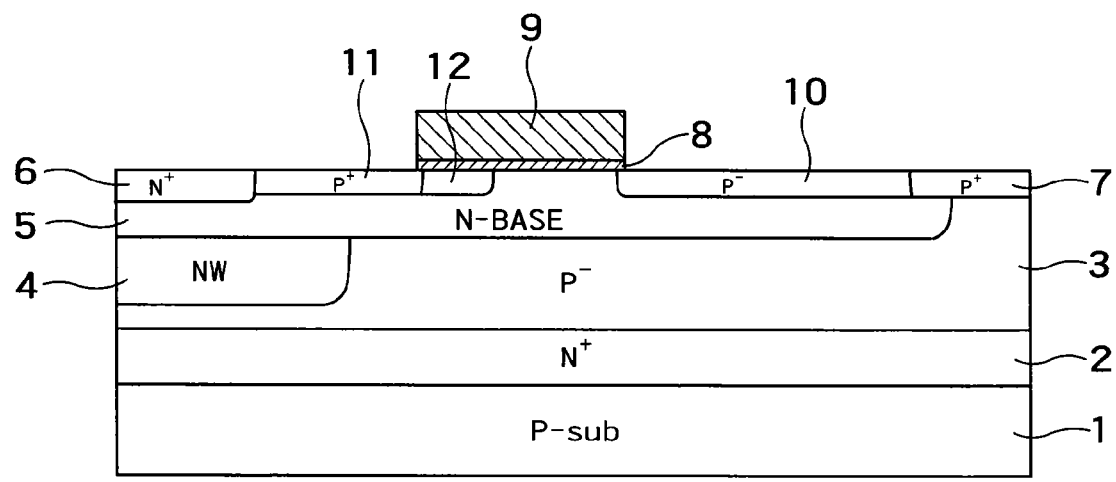
FIG. 13 is a sectional view of a semiconductor device of a different conductivity type corresponding to the semiconductor device shown in FIG. 1.

Then, as can be understood form FIGS. 12 and 13, an n⁺ type source layer 11 and an n⁺ type drain layer 7 are formed by the injecting or diffusing of an n type impurity. At the same time, an ion implanted channel region 12 and a RESURF layer 10 are formed. Separately, a p⁺ type layer 6 is formed by the injecting or diffusing of a p type impurity.

With respect to the aforementioned various types of devices and a method of manufacturing the device, the conductivity types of the semiconductors in the respective portions, in particular, the portions of the FET, can be reversed. For example, the example shown in FIG. 13 corresponds to the example shown in FIG. 1, in which the conductivity types are reversed.

Furthermore, although the n⁺ type (second conductivity type) semiconductor layer serving as the low resistance layer 2 is formed on the p type (first conductivity type) substrate 1, and the n⁻ type (second conductivity type) semiconductor layer serving as the high resistance layer 3 is formed thereon in FIG. 1, the substrate structure is not limited thereto.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

The invention claimed is:

1. A semiconductor device comprising:
   a semiconductor layer of a second conductivity type formed above a semiconductor substrate;
   a base layer of a first conductivity type selectively formed at a surface of the semiconductor layer;
   a gate electrode formed on the base layer via an insulating film;
   a source layer of a second conductivity type selectively formed at a surface of the base layer at one side of the gate electrode;
   an channel implantation layer selectively formed at the surface of the base layer so as to be adjacent to the source layer below the gate electrode, the channel implantation layer having a higher concentration than the base layer;
   a RESURF layer of the second conductivity type selectively formed at the surface of the base layer and the surface of the semiconductor layer at the other side of the gate electrode, so as to overlap the base layer and the semiconductor layer, wherein the RESURF layer includes a first portion at a side of the gate electrode and a second portion at a side opposite to the gate electrode which has a higher concentration than the first portion, the first portion is formed at the surface of the base layer and the second portion is formed so as to overlap the base layer and the semiconductor layer; and
   a drain layer of the second conductivity type selectively formed at the surface of the semiconductor layer so as to be adjacent to the RESURF layer, the drain layer having a higher concentration than the RESURF layer and the semiconductor layer.

2. The semiconductor device according to claim 1, wherein the semiconductor layer is formed above the semiconductor substrate with a second semiconductor layer formed therebetween, the second semiconductor layer has a second conductivity type and has a higher concentration than the semiconductor layer.

3. The semiconductor device according to claim 2, wherein the second semiconductor layer has a lower resistance than the semiconductor layer.

4. The semiconductor device according to claim 1, further comprising a first conductivity type layer which is formed adjacent to the source layer at a side opposite to a side of the channel implantation layer, wherein a source electrode is formed above both the first conductivity type layer and the source layer so as to bridge across the first conductivity type layer and the source layer, and the first conductivity type layer is selectively formed at the surface of the base layer and having a higher concentration than the base layer.

* * * * *